(12) United States Patent
Lee et al.

(10) Patent No.: US 11,586,379 B2
(45) Date of Patent: Feb. 21, 2023

(54) MEMORY SYSTEM AND METHOD OF OPERATING THE SAME

(71) Applicant: SK hynix Inc., Icheon-si (KR)

(72) Inventors: Do Hyeong Lee, Icheon-si (KR); Yu Jung Lee, Icheon-si (KR); Min Kyu Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/460,089

(22) Filed: Aug. 27, 2021

(65) Prior Publication Data

US 2022/0300196 A1  Sep. 22, 2022

(30) Foreign Application Priority Data

Mar. 18, 2021 (KR) .......................... 10-2021-0035534

(51) Int. Cl.
*G06F 3/06* (2006.01)

(52) U.S. Cl.
CPC .......... *G06F 3/0656* (2013.01); *G06F 3/0604* (2013.01); *G06F 3/0679* (2013.01)

(58) Field of Classification Search
CPC ....... G06F 3/0604; G06F 3/0656; G06F 12/10
USPC ....................................................... 711/154
See application file for complete search history.

(56) References Cited

U.S. PATENT DOCUMENTS

| 10,254,983 | B2* | 4/2019 | Tomlin | G06F 3/0619 |
| 2014/0297918 | A1* | 10/2014 | Lee | G06F 12/0804 |
| | | | | 711/102 |
| 2020/0125268 | A1* | 4/2020 | Li | G06F 3/0659 |
| 2020/0409845 | A1* | 12/2020 | Lee | G06F 12/0804 |

FOREIGN PATENT DOCUMENTS

| KR | 10-1301840 B1 | 6/2012 |
| KR | 1020200040544 A | 4/2020 |

* cited by examiner

*Primary Examiner* — Than Nguyen

(57) ABSTRACT

A memory system may include a memory device including at least one sequential area in which a data corresponding to consecutive logical addresses of the at least one sequential area is stored, a sequential buffer configured to temporarily store the data to be stored in the at least one sequential area, a meta buffer configured to store a meta data including a write pointer information indicating a logical address in which data is to be stored from among logical addresses corresponding to the at least one sequential area, and an area state information indicating whether the sequential buffer is allocated to the at least one sequential area, and a memory controller configured to perform a write operation of storing the data in the at least one sequential area in response to a first command received from the host using the meta data.

21 Claims, 12 Drawing Sheets

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2021-0035534 filed on Mar. 18, 2021, in the Korean Intellectual Property Office, the entire disclosure of which is incorporated by reference herein.

BACKGROUND

1. Field of Invention

The present disclosure relates to an electronic device, and more particularly, to a memory system and a method of operating the same.

2. Description of Related Art

A memory system is a device that stores data under control of a host device such as a computer or a smartphone. The memory system may include a memory device in which data is stored and a memory controller controlling the memory device. Memory devices can be classified into volatile memory devices and nonvolatile memory devices.

A volatile memory device is a device that stores data only when power is supplied and loses the stored data when the power supply is cut off. Volatile memory devices include a static random access memory (SRAM), a dynamic random access memory (DRAM), and the like.

A nonvolatile memory device is a device that does not lose data even after power is cut off. Nonvolatile memory devices include a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a memory system that manages a journal for each sequential area, and a method of operating the same.

According to an embodiment of the present disclosure, a memory system may include a memory device including at least one sequential area in which a data provided from a host and corresponding to consecutive logical addresses of the at least one sequential area is stored, a sequential buffer configured to temporarily store the data to be stored in the at least one sequential area, a meta buffer configured to store a meta data including a write pointer information indicating a logical address in which the data is to be stored from among logical addresses corresponding to the at least one sequential area, and an area state information indicating whether the sequential buffer is allocated to the at least one sequential area and a memory controller configured to perform a write operation of storing the data in the at least one sequential area in response to a first command received from the host using the meta data. The memory controller may generate a journal data including a write pointer information and an area state information corresponding to the at least one sequential area in which the write operation is performed in response to the first command, and updates the journal data in response to a second command for an operation in the at least one sequential area with pre-existing journal data.

According to an embodiment of the present disclosure, a memory system may include a memory device including including at least one sequential area in which a data corresponding to consecutive logical addresses of the at least one sequential area provided from a host is stored, a sequential buffer configured to temporarily store the data to be stored in the at least one sequential area, a meta buffer configured to store a first meta data including a write pointer information indicating a logical address in which the data is to be stored from among logical addresses corresponding to the at least one sequential area, and an area state information indicating whether the sequential buffer is allocated to the at least one sequential area and a memory controller configured to perform a write operation of storing the data in the at least one sequential area in response to a first command received from the host using the first meta data, to generate a journal data including a write pointer information and an area state information corresponding to the at least one sequential area in which a write operation is performed in response to a first command, and to restore a second meta data stored in the meta buffer using the first meta data stored in the memory device and the journal data stored in the memory device when the sudden power off occurs. The memory controller may update the journal data in response to a second command for an operation in the at least one sequential area with pre-existing journal data.

According to an embodiment of the present disclosure, a method of operating a memory system comprising a memory device including at least one sequential area in which a data corresponding to consecutive logical addresses provided from a host is stored, a sequential buffer configured to temporarily store the data to be stored in the at least one sequential area, a meta buffer configured to store a meta data including a write pointer information indicating a logical address in which the data is to be stored from among logical addresses corresponding to the at least one sequential area, and an area state information indicating whether the sequential buffer is allocated to the at least one sequential area, and a memory controller configured to perform a write operation of storing the data in the at least one sequential area in response to a first command received from the host using the meta data may include generating a journal data including a write pointer information and an area state information corresponding to the at least one sequential area in which the write operation is performed in response to the first command, and updating the journal data in response to a second command for the at least one sequential area in which the journal data exists.

According to the present technology, a memory system that manages a journal for each sequential area, and a method of operating the same may be provided.

DETAILED DESCRIPTION

Specific structural or functional descriptions of embodiments according to the concepts that are disclosed in the present specification or application are illustrated only to describe the embodiments according to the concepts of the present disclosure. The embodiments according to the concepts of the present disclosure may be carried out in various forms and should not be construed as being limited to the embodiments described in the present specification or application.

Figure 1:
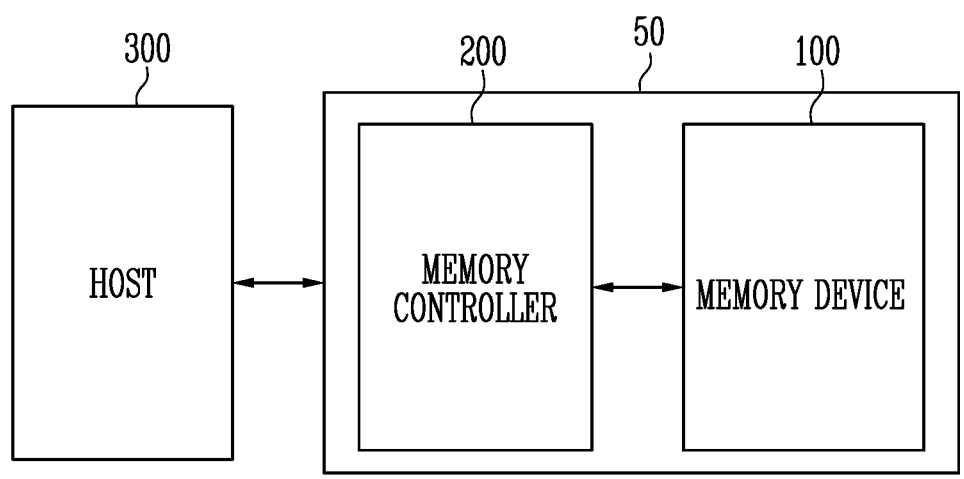
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, a memory system 50 may include a memory device 100 and a memory controller 200 that controls an operation of the memory device. The memory system 50 may be a device that stores data under the control of a host 300, such as a cellular phone, a smartphone, an MP3 player, a laptop computer, a desktop computer, a game player, a TV, a tablet PC, or an in-vehicle infotainment system.

The memory system 50 may be manufactured as one of various types of storage devices according to a host interface that is a communication method with the host 300. For example, the memory system 50 may be configured as any one of various types of storage devices such as a solid-state drive (SSD), a multimedia card in a form of a multi-media card (MMC), an embedded MMC (eMMC), a reduced-size MMC (RS-MMC) and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The memory system 50 may be manufactured as any one of various types of packages. For example, the memory system 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under the control of the memory controller 200. The memory device 100 may include a memory cell array (not shown) including memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits The memory cell array (not shown) may include a plurality of memory blocks. Each memory block may include a plurality of memory cells. One memory block may include a plurality of pages. In an embodiment, a page may be a unit for storing data in the memory device 100 or for reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area selected by the address in the memory cell array. The memory device 100 may perform an operation instructed by the command on the area selected by the address. For example, the memory device 100 may perform a program operation, a read operation, and an erase operation. During a program operation, the memory device 100 may store data in the area selected by the address. In the present disclosure, an operation of storing data may be expressed as a program operation or a write operation. During a read operation, the memory device 100 may read data from the area selected by the address. During an erase operation, the memory device 100 may erase data stored in the area selected by the address.

In an embodiment, the memory device 100 may include a plurality of planes. A plane may be a unit capable of independently performing an operation. For example, the memory device 100 may include two, four, or eight planes.

The planes may independently perform, simultaneously or at the same time, a program operation, a read operation, or an erase operation.

In an embodiment, the memory device 100 may include a sequential area. The sequential area may be an area in which logical block addresses (LBAs) are successive. The memory controller 200 may perform a write operation of storing data in the sequential area. The LBAs of the data stored in the sequential area may be successive. The memory device 100 may include a plurality of sequential areas having different sizes. The memory device 100 may be divided and used in units of the sequential areas.

The sequential areas may include an active area, in which a write operation is possible, and an inactive area, in which a write operation is impossible. The active area may include an open area to which a sequential buffer is allocated and a closed area to which the sequential buffer is not allocated. The sequential buffer may be a buffer memory that stores data to be stored in the sequential area. The inactive area may include an empty area in which data is not stored in the sequential area and a full area in which data is stored in the sequential area.

The memory controller 200 may receive an explicit open command from the host 300 to convert a sequential area into an open area. The memory controller 200 may allocate a sequential buffer to the sequential area corresponding to the explicit open command. The memory controller 200 may sequentially store data received from the host 300 in the sequential area to which the sequential buffer is allocated.

The memory controller 200 may receive only identification information for the sequential area and a command instructing a write operation from the host 300 without the explicit open command. The memory controller 200 may allocate the sequential buffer to the sequential area corresponding to the received identification information. The memory controller 200 may sequentially store the data received from the host 300 in the sequential area to which the sequential buffer is allocated.

The memory controller 200 may receive a command from the host 300 to convert an open area to a closed area. Data may not be stored in a sequential area converted from an open area to a closed area. When the sequential buffer to be allocated to a sequential area is insufficient, the memory controller 200 may select at least one open area from among the open areas and convert the selected open area into the closed area.

The memory controller 200 may control an overall operation of the memory system 50.

When power is applied to the memory system 50, the memory controller 200 may execute firmware (FW). When the memory device 100 is a flash memory device, the firmware (FW) may include a host interface layer (HIL) that controls communication with the host 300, and the memory controller 200 may include a flash translation layer (FTL) that controls communication between the host 300 and the memory device 100, and a flash interface layer (FIL) that controls communication with the memory device 100.

The memory controller 200 may receive data to be stored and a logical block address (LBA) from the host 300 and may convert the LBA into a physical block address (PBA) indicating an address of memory cells in which data included in the memory device 100 is to be stored. In the present specification, the LBA and a "logic address" or a "logical address" may be used with the same meaning. In the present specification, the PBA and a "physical address" may be used with the same meaning.

The memory controller 200 may control the memory device 100 to perform a program operation, a read operation, an erase operation, or the like according to a request of the host 300. During a program operation, the memory controller 200 may provide a program command, the PBA, and data to the memory device 100. During a read operation, the memory controller 200 may provide a read command and the PBA to the memory device 100. During an erase operation, the memory controller 200 may provide an erase command and the PBA to the memory device 100.

In an embodiment, the memory controller 200 may generate a command, an address, and data independently, regardless of any request from the host 300, and may transmit the command, the address, and the data to the memory device 100. For example, the memory controller 200 may provide to the memory device 100 commands, addresses, and data for performing read and program operations accompanying wear leveling, read reclaim, garbage collection similar operations.

In an embodiment, the memory controller 200 may control at least two or more memory devices 100. For example, the memory controller 200 may control multiple memory devices 100 according to an interleaving method to improve operation performance. The interleaving method may be a method of controlling overlapping operations for at least two memory devices 100. The interleaving method may be a method in which at least two or more memory devices 100 operate in parallel.

The buffer memory (not shown) may temporarily store data provided from the host 300, that is, data to be stored in the memory device 100, or may temporarily store data read from the memory device 100. In an embodiment, the buffer memory (not shown) may be a volatile memory device. For example, the buffer memory (not shown) may be a dynamic random access memory (DRAM) or a static random access memory (SRAM). In the present disclosure, a buffer memory may have the same meaning as a buffer.

The host 300 may communicate with the memory system 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
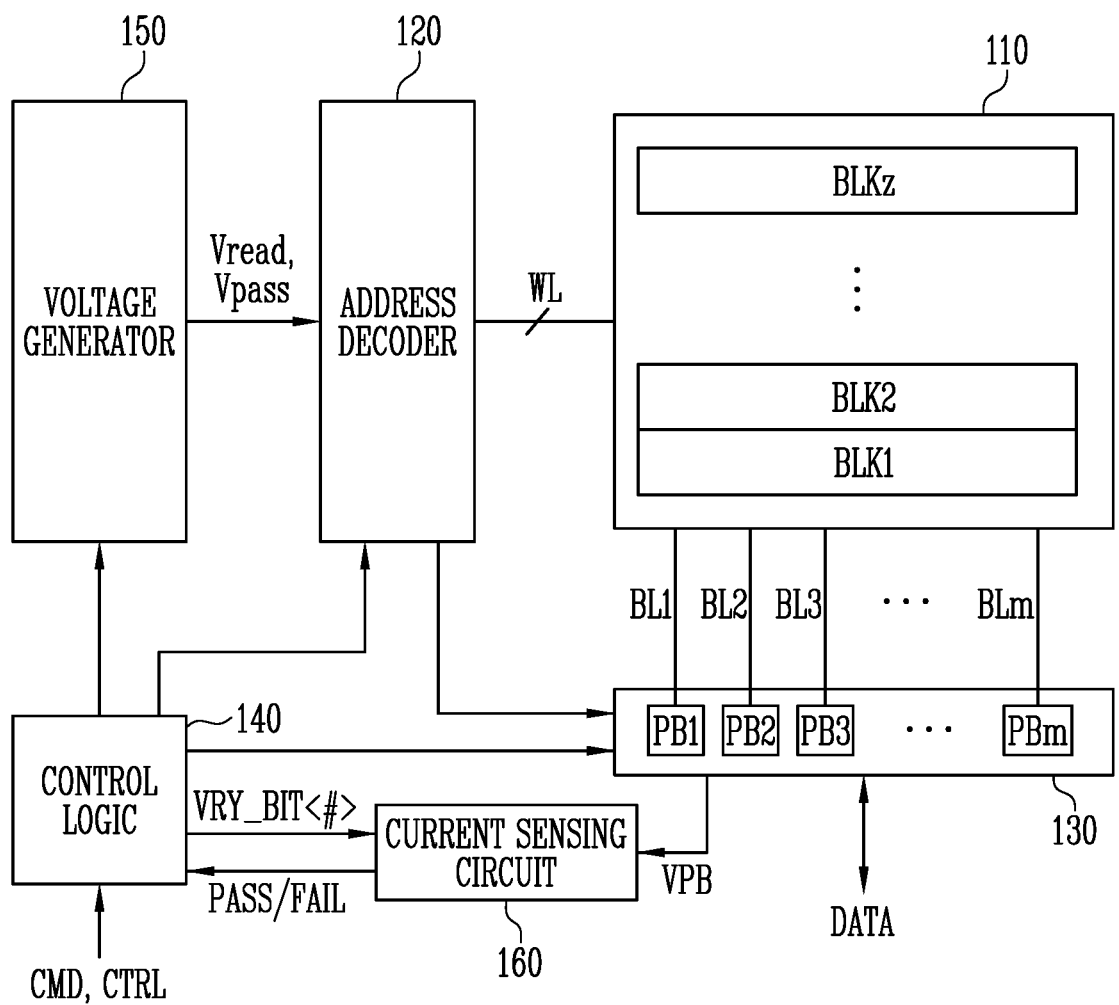
FIG. 2 is a diagram illustrating a memory device of FIG. 1.

FIG. 2 is a diagram illustrating a memory device of FIG. 1.

Referring to FIG. 2, a memory device 100 includes a memory cell array 110, an address decoder 120, a read and write circuit 130, a control logic 140, a voltage generator 150, and a current sensing circuit 160. The address decoder 120, the read and write circuit 130, the voltage generator 150, and the current sensing circuit 160 may be referred to as a peripheral circuit controlled by the control logic 140.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured with non-volatile memory cells having a vertical channel structure. The memory cell array 110 may be configured as a memory cell array with a two-dimensional structure. According to another embodiment, the memory cell array 110 may be configured as a memory cell array with a three-dimensional structure. Each of the plurality of memory cells included in the memory cell array may store at least one bit of data. In an embodiment, each of the plurality of memory cells included in the memory cell array 110 may be an SLC storing one bit of data. In another embodiment, each of the plurality of memory cells included in the memory cell array 110 may be an MLC storing two bits of data. In still another embodiment, each of the plurality of memory cells included in the memory cell array 110 may be a TLC storing three bits of data. In yet another embodiment, each of the plurality of memory cells included in the memory cell array 110 may be a QLC storing four bits of data. In a further embodiment, the memory cell array 110 may include a plurality of memory cells each storing five or more bits of data.

The address decoder 120 is connected to the memory cell array 110 through the word lines WL. The address decoder 120 is configured to operate in response to control of the control logic 140. The address decoder 120 receives an address through an input/output buffer (not shown) inside the memory device 100.

The address decoder 120 is configured to decode a block address from among received addresses. The address decoder 120 selects at least one memory block according to the decoded block address. In addition, the address decoder 120 applies a read voltage Vread generated in the voltage generator 150 to a selected word line of the selected memory block, during a read voltage application operation of a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 may be configured to decode a column address of the received addresses. The address decoder 120 transmits the decoded column address to the read and write circuit 130.

The read operation and the program operation of the memory device 100 are performed in a page unit. Addresses received with read operation and program operation requests include a block address, a row address, and a column address. The address decoder 120 selects one memory block and one word line according to the block address and the row address. The column address is decoded by the address decoder 120 and is provided to the read and write circuit 130. In the present specification, memory cells connected to one word line may be referred to as a "physical page".

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During a read operation and a program verify operation, in order to sense a threshold voltage of the memory cells, the plurality of page buffers PB1 to PBm senses a change in the amount of a current flowing according to a programmed state of a corresponding memory cell through a sensing node, while continuously supplying a sensing current to the bit lines connected to the memory cells, and latches the sensed change as sensing data. The read and write circuit 130 operates in response to page buffer control signals output from the control logic 140. In the present specification, a write operation of the read and write circuit may be used with the same meaning as a program operation of storing data in the memory cells.

During the read operation, the read and write circuit 130 senses data of the memory cell, temporarily stores read data, and outputs data to the input/output buffer (not shown) of the memory device 100. In an exemplary embodiment, the read and write circuit 130 may include a column select circuit, and the like, in addition to the page buffers (or page registers). The read and write circuit 130 may be a page buffer according to an embodiment of the present disclosure.

The control logic 140 is connected to the address decoder 120, the read and write circuit 130, the voltage generator 150, and the current sensing circuit 160. The control logic 140 receives a command CMD and a control signal CTRL through the input/output buffer (not shown) of the memory device 100. The control logic 140 is configured to control overall operations of the memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform read operations of the memory cell array 110.

Meanwhile, the control logic 140 may determine whether a verify operation on a specific target program state is passed or failed in response to a pass signal PASS or a fail signal FAIL received from the current sensing circuit 160.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The current sensing circuit 160 may generate a reference current and a reference voltage in response to a permission bit VRY_BTI<#> received from the control logic 140 during a verify operation. A pass signal PASS or a fail signal FAIL may be output by comparing the generated reference voltage with a sensing voltage VPB received from the page buffers PB1 to PBm, which are included in the read and write circuit 130, or by comparing the generated reference current with a sensing current received from the page buffers PB1 to PBm.

The address decoder 120, the read and write circuit 130, the voltage generator 150, and the current sensing circuit 160 may function as the "peripheral circuit" that performs read operations, write operations, and erase operations on the memory cell array 110. The peripheral circuit performs read operations, write operations, and erase operations on the memory cell array 110 under the control of the control logic 140.

Figure 3:
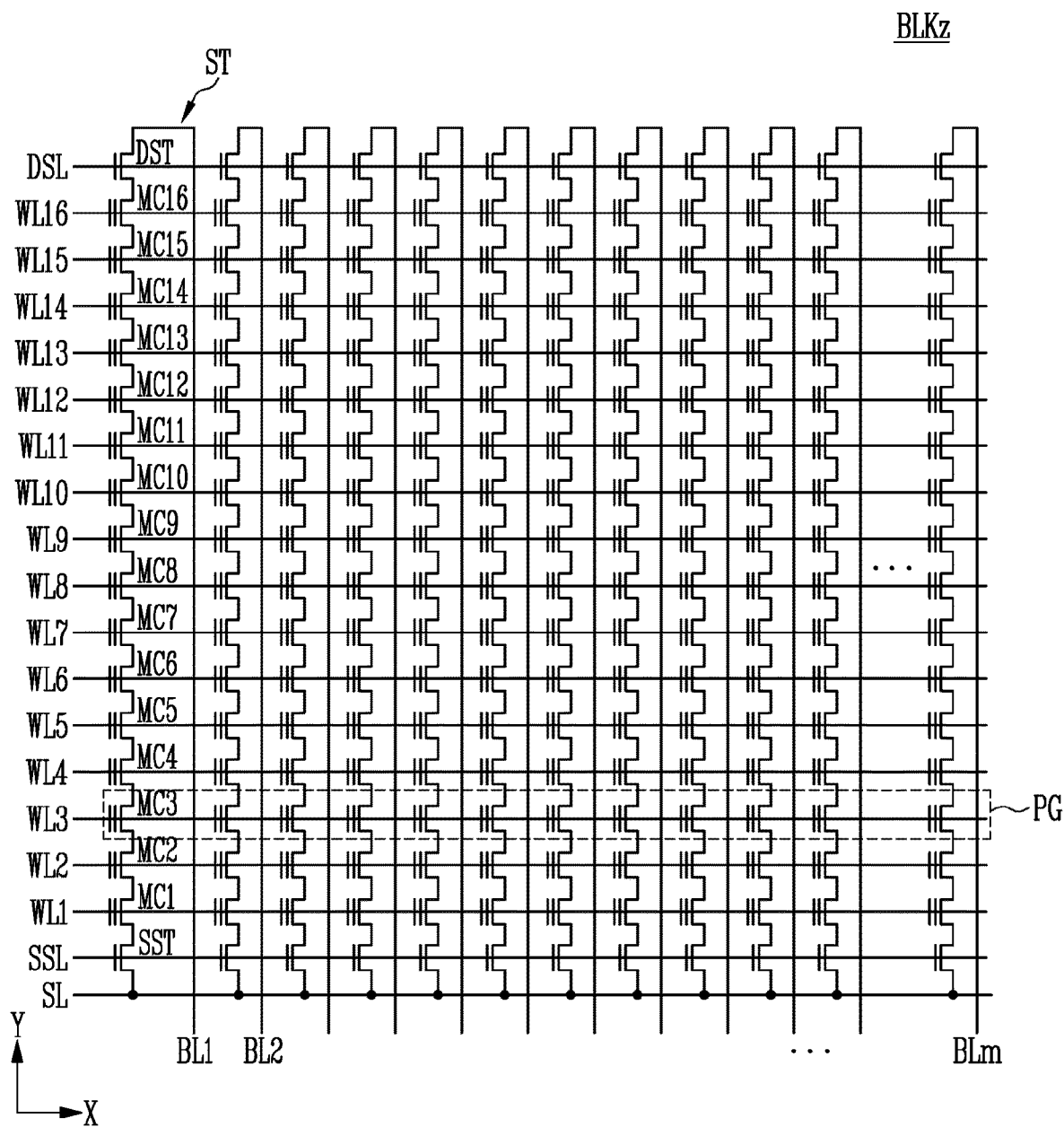
FIG. 3 is a diagram illustrating a configuration of any one of memory blocks of FIG. 2.

FIG. 3 is a diagram illustrating a configuration of any one of the memory blocks of FIG. 2.

A memory block BLKz is any one memory block BLKz among the memory blocks BLK1 to BLKz of FIG. 2, where z is an integer.

Referring to FIG. 3, a plurality of word lines arranged in parallel with each other may be connected between a first select line and a second select line. Here, the first select line may be the source select line SSL, and the second select line may be the drain select line DSL. More specifically, the memory block BLKz may include a plurality of strings ST connected between the bit lines BL1 to BLm and the source line SL. The bit lines BL1 to BLm may be connected to the strings ST, respectively, and the source line SL may be commonly connected to the strings ST. An exemplary string ST connected to the first bit line BL1 is specifically described below as an example, and other strings ST may be configured to be identical to the exemplary string ST and to each other.

The exemplary string ST may include a source select transistor SST, a plurality of memory cells MC1 to MC16, and a drain select transistor DST connected in series between the source line SL and the first bit line BL1. Other strings ST may include at least one or more of the source select transistor SST and the drain select transistor DST, and may include the more memory cells than memory cells MC1 to MC16 illustrated in FIG. 3.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line, from among the memory cells included in different strings ST, may be referred to as a page PG. Therefore, the memory block BLKz may include the same number of pages PG as the number of the word lines WL1 to WL16.

One memory cell may store one bit of data. This is commonly called an SLC. In this case, one physical page PG may store one logical page (LPG) of data. The one logical page (LPG) of data may include data bits of the same number as the number of cells included in one physical page PG.

The one memory cell may store two or more bits of data. In this case, one physical page PG may store two or more logical pages (LPG) of data.

Figure 4:
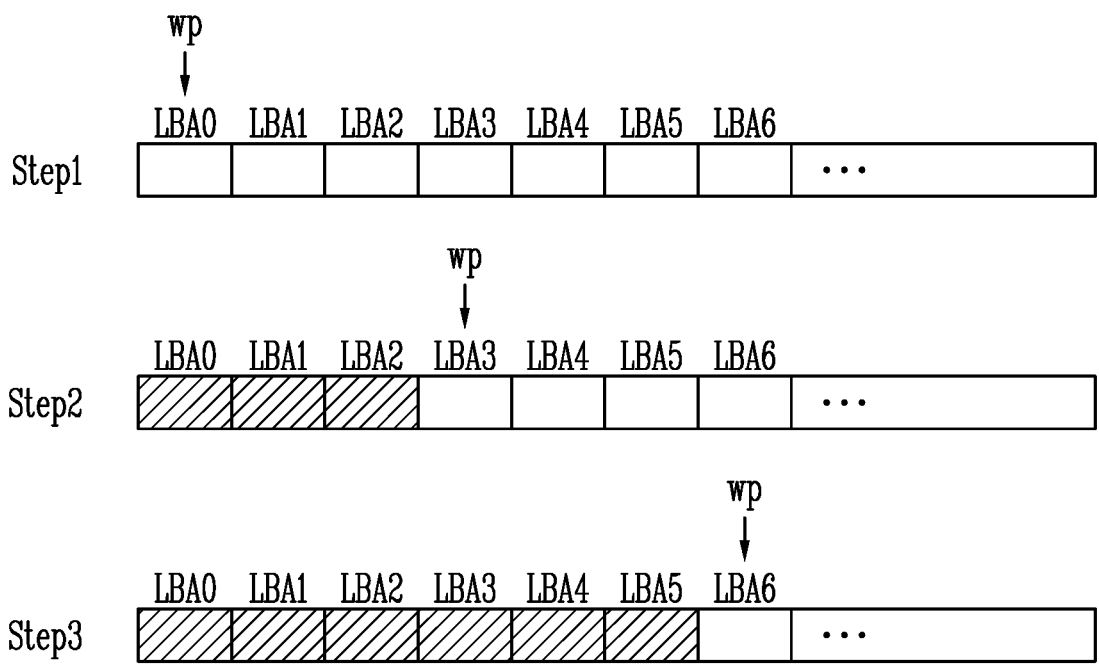
FIG. 4 is a diagram illustrating a write operation performed on a sequential area.

FIG. 4 is a diagram illustrating a write operation performed on a sequential area.

Referring to FIG. 4, a plurality of pages may be included in the sequential area. Logical addresses allocated to neighboring pages may be continuous. The memory controller may perform write operations of storing data provided from the host in each of the plurality of pages included in the sequential area. The logical addresses of the stored data may be continuous. The stored data may be stored in a sequential buffer before being stored in the sequential area.

A write pointer wp may indicate one of logical addresses LBA0, LBA1, LBA2, LBA3, LBA4, LBA5, LBA6, and so on, in which data is stored in the sequential area. Information on the logical address indicated by the write pointer wp may be referred to as write pointer information. The memory controller may store data in a page corresponding to the logical address indicated by the write pointer wp. In FIG. 4, a page in which data is stored may be shown as a hatched space, and a page in which data is not stored may be shown as an empty or white space. The sequential area may be an open area. Each time the memory controller performs a write operation, the logical address indicated by the write pointer wp may be increased.

Step1 may illustrate a sequential area in which data is not stored. Since the memory controller stores data in the sequential area from the logical address 0 at LBA0, the write pointer wp may indicate the logical address 0.

Step2 may illustrate a sequential area in which data is stored in a page corresponding to the logical addresses 0 to 2, i.e., LBA0 to LBA2. After data is stored in the logical address 2 (LBA2), the write pointer wp may indicate the logical address 3 (LBA3), which is a next logical address.

Step3 may indicate a sequential area in which data is stored in a page corresponding to the logical address 0 (LBA0) to the logical address 5 (LBA5). The memory controller may sequentially store data in the sequential area indicated by the write pointer wp from the logical address 3 (LBA3). When data is stored up to the logical address 5 (LBA5), the write pointer wp may indicate the logical address 6 (LBA6).

After processing Step3, data may be sequentially stored according to the logical address indicated by the write pointer wp, according to a command received from the host. As illustrated by step 1 (Step1), step 2 (Step2), and step 3 (Step3), write operations may be sequentially performed. As the write operations proceed, data may be sequentially stored in the sequential area.

Figure 5:
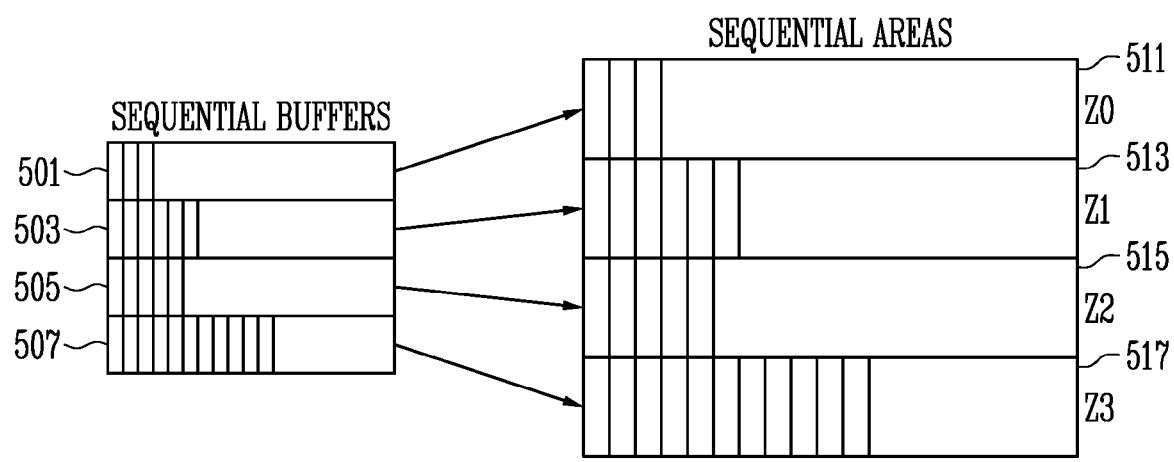
FIG. 5 is a diagram illustrating an operation of storing data stored in a plurality of sequential buffers, in each of a plurality of sequential areas.

FIG. 5 is a diagram illustrating an operation of storing data stored in a plurality of sequential buffers, in each of a plurality of sequential areas.

Referring to FIG. 5, data stored in a plurality of sequential buffers may be stored in a plurality of sequential areas. A memory controller may allocate a sequential buffer required for a write operation in a sequential area. In FIG. 5, for convenience of description, four sequential areas and four sequential buffers are illustrated, but the number of sequential areas and sequential buffers is not limited thereto. The plurality of sequential buffers 501, 503, 505, and 507 may correspond to the plurality of sequential areas 511, 513, 515, and 517, respectively.

For example, the sequential buffer 501 may correspond to the sequential area 511, and the sequential buffer 503 may correspond to the sequential area 513. The sequential buffer 505 may correspond to the sequential area 515, and the sequential buffer 507 may correspond to the sequential area 517. The data corresponding to the consecutive logical addresses provided from the host may be stored in the sequential buffers 501, 503, 505, and 507, respectively. An operation of sequentially storing the data stored in the sequential buffer in the sequential area may correspond to the description of FIG. 4.

The data stored in the sequential buffer may be stored in the sequential area only when the sequential area satisfies an optimal write size (OWS), which is a minimum size unit of a programmable data. For example, the OWS may be 96 Kb or 192 Kb.

FIG. 5 illustrates sequential areas having different OWSs. For example, the sequential area 511 may have an OWS corresponding to a size of data stored in three logical addresses, and the sequential area 513 may have an OWS corresponding to a size of data stored in six logical addresses. The sequential area 515 may have an OWS corresponding to a size of data stored in five logical addresses, and the sequential area 517 may have an OWS corresponding to a size of data stored in eleven logical addresses. The sequential buffers 501, 503, 505, and 507 are capable of storing data equal to or greater than the OWS for each of the sequential areas 511, 513, 515, and 517, so the memory controller may store the data stored in the sequential buffers 501, 503, 505, and 507 in the sequential areas 511, 513, 515, and 517.

The memory controller may store the data stored in the sequential buffer 501 to correspond to the logical address 0, the logical address 1, and the logical address 2 of the sequential area 511. The memory controller may store the data stored in the sequential buffer 503 to correspond to the logical address 0, the logical address 1, the logical address 2, the logical address 3, the logical address 4, and the logical address 5 of the sequential area 513. The memory controller may store the data stored in the sequential buffer 505 to correspond to the logical address 0, the logical address 1, the logical address 2, the logical address 3, and the logical address 4 of the sequential area 515. The memory controller may store the data stored in the sequential buffer 507 to correspond to the logical address 0, the logical address 1, the logical address 2, the logical address 3, the logical address 4, the logical address 5, the logical address 6 the logical address 7, the logical address 8, the logical address 9, and the logical address 10 of the sequential area 517.

Instead of sequential areas having different OWSs, the OWS of the sequential areas 511, 513, 515, and 517 may be fixed. For example, it may be assumed that the OWS of the sequential areas 511, 513, 515, and 517 is equivalent to a size of data stored in five logical addresses. As a result, data may not be stored in a 0-th sequential area Z0 in the sequential area 511 because a size of the data stored in the sequential buffer 501 is less than the OWS. However, a size of the data stored in the remaining sequential buffers 503, 505, and 507 is greater than the OWS, and therefore data from these buffers may be stored in a first sequential area Z1, a second sequential area Z2, and a third sequential area Z3. Referring to FIG. 4, sequential area Z0 may correspond to Step1 in which data is not stored in the 0-th sequential area Z0. In contrast, the first sequential area Z1 and the second sequential area Z2 may correspond to the sequential area 515 of FIG. 5 because the OWS is a size of data stored in five logical addresses. Although the third sequential area Z3 is not illustrated in FIG. 4 or FIG. 5, the third sequential area Z3 may have data stored in a multiple of the OWS, namely in ten logical addresses (the logical address 0, the logical address 1, the logical address 2, the logical address 3, the logical address 4, the logical address 5, the logical address 6 the logical address 7, the logical address 8, and the logical address 9).

Figure 6:
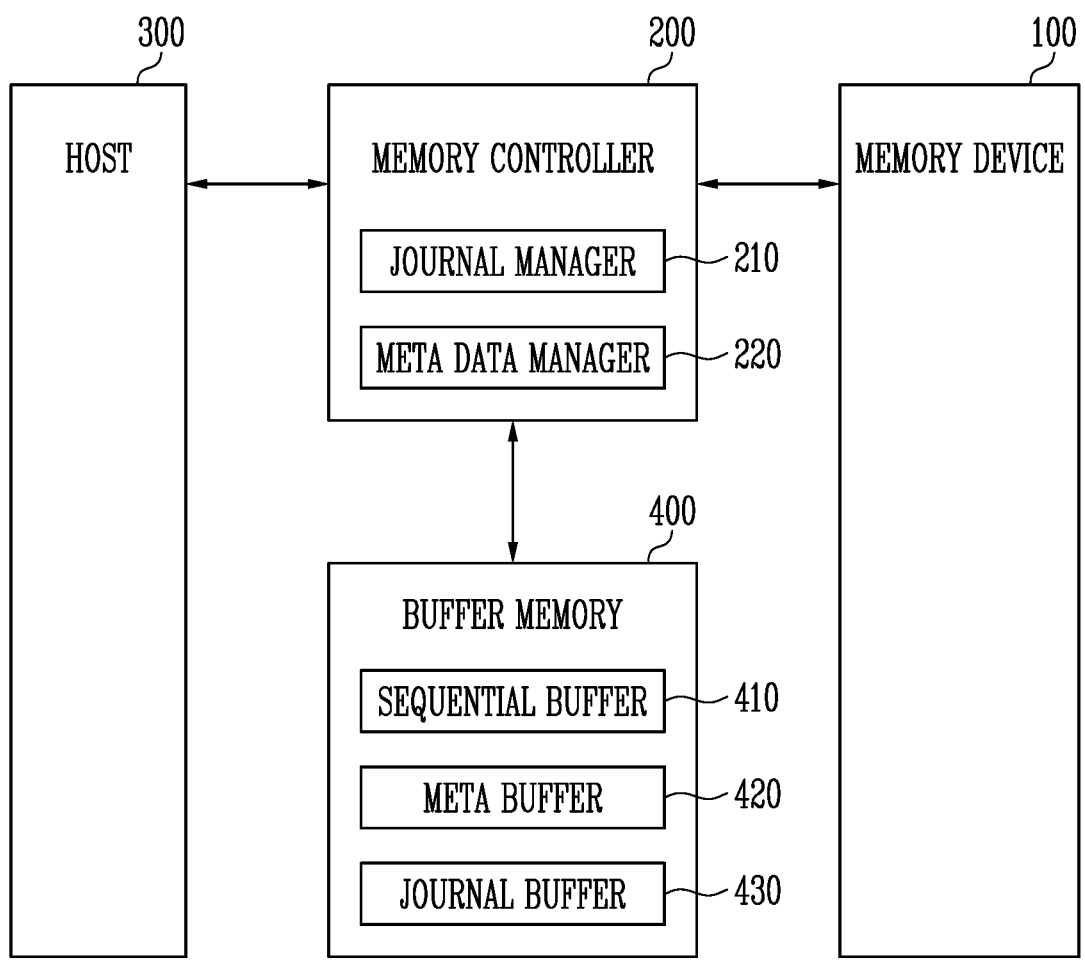
FIG. 6 is a block diagram illustrating a method of updating journal data according to an embodiment of the present disclosure.

FIG. 6 is a block diagram illustrating a method of updating journal data according to an embodiment of the present disclosure.

Referring to FIG. 6, a memory controller 200 may receive an operation command and data to be stored in a memory device 100 from a host 300. The memory controller 200 may temporarily store the data to be stored in the memory device 100 in the buffer memory 400.

In an embodiment, the memory device 100 may include sequential areas having different sizes. The sequential areas may include a plurality of physical blocks. Data may be stored in each of the sequential areas, and consecutive logical addresses may be allocated to each of the sequential areas.

The memory device 100 may include at least one sequential area in which data corresponding to the consecutive logical addresses provided from the host 300 is respectively stored. The sequential area may include a plurality of physical blocks. Referring to FIG. 5 and its descriptions, when data equal to or greater than the OWS of the sequential area is stored in a sequential buffer 410, the memory controller 200 may store data in the sequential area. In an embodiment of the present disclosure, the memory device 100 may store a portion of the data stored in the buffer memory 400.

The memory controller 200 may perform a write operation of storing data in a sequential area in response to a first command received from the host 300. The memory controller 200 may further include a journal manager 210 and a meta data manager 220. The memory controller 200 may generate journal data corresponding to the sequential area in which the write operation is performed in response to the first command.

The journal data may include write pointer information indicating a logical address in which data is to be stored from among the logical addresses corresponding to the sequential area, and area state information indicating whether the sequential buffer 410 is allocated to the sequential area. The write pointer information may correspond to information on the write pointer wp of FIG. 4. The area state information may be information indicating whether the sequential area is an open area or information indicating whether the sequential area is a closed area.

The memory controller 200 may update the journal data in response to a second command for the sequential area in which the journal data exists. The memory controller 200 may update existing journal data without generating new journal data for the sequential area in which the journal data exists. In the updated journal data, the write pointer information or the area state information, or both, may be changed.

When a write operation is performed in response to a second command received from the host 300, the journal manager 210 may change the write pointer information included in the journal data. For example, when the write operation is performed, the data corresponding to the OWS may be stored in the sequential area. The journal manager 210 may change the write pointer information included in the journal data because the logical address indicated by the write pointer is changed by the write operation.

When the allocation-or-not of the sequential buffer 410 is changed in response to a second command received from the host 300, the journal manager 210 may change the area state information included in the journal data. For example, the sequential buffer 410 allocated to the sequential area may be released. The journal manager 210 may change the area state information included in the journal data from an information indicating an open area to an information indicating a closed area. According to the changed area state information, the write operation may be ended in the sequential area.

The meta data manager 220 may generate meta data for the sequence area in response to a first command received from the host 300. The meta data may include write pointer information and area state information. When the write operation is performed in response to a second command received from the host 300, the meta data manager 220 may change the write pointer information included in the meta data. When a state of the sequential area is changed in response to the second command received from the host 300, the meta data manager 220 may change the area state information included in the meta data.

The journal manager 210 and the meta data manager 220 may store data in the memory device 100. Specifically, the journal manager 210 may store the journal data in the memory device 100 when a size of the journal data exceeds a predetermined value. The meta data manager 220 may store the meta data in the memory device 100 when a size of the meta data exceeds a predetermined value. In another embodiment of the present disclosure, the journal manager 210 may store the journal data in the memory device 100 according to a predetermined time interval. The meta data manager 220 may store the meta data in the memory device 100 according to a predetermined time interval.

The buffer memory 400 may temporarily store the data to be stored in the memory device 100. The buffer memory 400 may further include a sequential buffer 410, a meta buffer 420, and a journal buffer 430.

The sequential buffer 410 may temporarily store the data to be stored in the sequential area. The sequential buffer 410 may correspond to the description of the sequential buffers 501, 503, 505, and 507 of FIG. 5. The memory controller 200 may temporarily store data in the sequential buffer 410 before storing the data in the sequential area included in the memory device 100.

The meta data manager 220 may store the meta data generated in response to the first command received from the host 300 in the meta buffer 420. In addition, the meta data manager 220 may generate new meta data for the sequential area or update the existing meta data in response to the second command received from the host 300. The meta buffer 420 may store the meta data including the write pointer information and the area state information corresponding to the sequential area.

The journal manager 210 may store the journal data generated in response to the first command received from the host 300 in the journal buffer 430, and update the journal data in response to the second command received from the host 300. The journal manager 210 may update the journal data based on the meta data stored in the meta buffer 420. The journal buffer 430 may store the journal data including the write pointer information and the area state information corresponding to the sequential area.

For example, the meta data and the journal data may be generated in relation to a sequential area by a first command received from the host 300. In addition, when a write operation is performed due to a second command received from the host 300, the logical address indicated by the write pointer may be changed in accordance with the OWS of the sequential area. The meta data manager 220 may generate a new meta data including the changed write pointer information or may update the write pointer information included in the meta data. The journal manager 210 may update the write pointer information included in the journal data based on the updated or new meta data. Also, if an area state corresponding to the sequential area is changed, then the meta data and the journal data may be updated as well.

Figure 7:
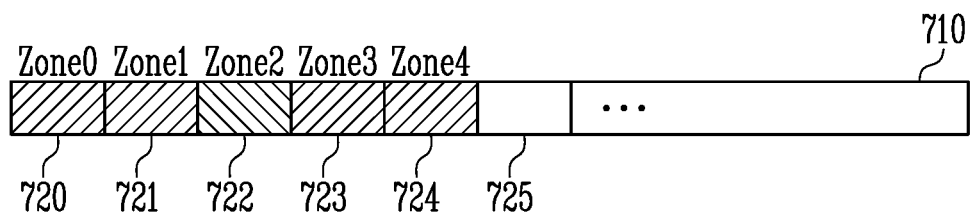
FIG. 7 is a diagram illustrating a method of updating journal data according to an embodiment of the present disclosure.

FIG. 7 is a diagram illustrating a method of updating journal data according to an embodiment of the present disclosure.

Referring to FIG. 7, journal data 720, 721, 722, 723 and 724 are stored in a journal buffer 710. In FIG. 7, a hatched portion may indicate the journal data 720, 721, 722, 723, and 724 stored in the journal buffer 710. An empty space 725 of the journal buffer 710 may indicate a space in which journal data is not stored.

The journal data 720, 721, 722, 723, and 724 may correspond to sequential areas Zone0, Zone1, Zone2, Zone3, and Zone4, respectively. When the journal data 722 corresponding to the second sequential area Zone2 exists, a write operation on the second sequential area may be performed. When the write operation is performed, the write pointer information may be changed in the second sequential area.

Referring to FIG. 6, the meta data manager 220 may generate new meta data including the changed write pointer information or may change the write pointer information included in the existing meta data. In addition, the journal manager 210 may change the write pointer information included in the journal data 722 based on the changed meta data. For example, the journal manager 210 does not store new journal data in the empty space 725 of the journal buffer 710 for the second sequential area Zone2, in which the journal data 722 exists. Instead, the journal manager 210 may change the journal data 722 corresponding to the second sequential area Zone2 using the revised meta data.

When the plurality of sequential areas Zone0, Zone1, Zone2, Zone3, and Zone4 exist in the memory device, the journal manager 210 may update the journal data corresponding to each of the sequential areas. The empty space 725 of the journal buffer 710 may store journal data for another sequential area (for example, the fifth sequential area).

Figure 8:
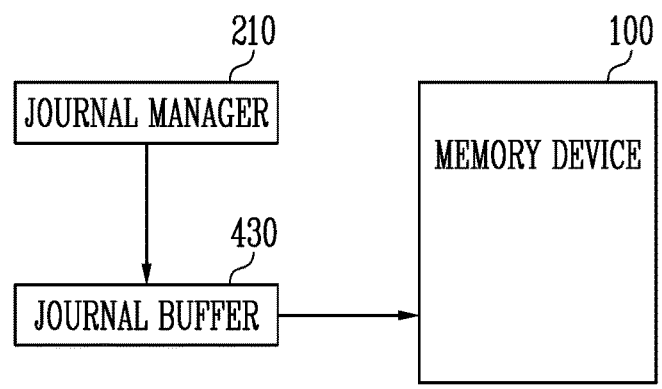
FIG. 8 is a diagram illustrating an operation when a sudden power off occurs according to an embodiment of the present disclosure.

FIG. 8 is a diagram illustrating an operation when a sudden power off occurs according to an embodiment of the present disclosure.

Referring to FIG. 8, when a sudden power off (SPO) occurs, the journal manager 210 may store the journal data stored in the journal buffer 430 in the memory device 100. However, because the meta data stored in the meta buffer 420 of FIG. 6 includes a plurality of meta data for the sequential area or includes additional information on the sequential area, a size of the meta data may be relatively greater than that of the journal data. Therefore, when the SPO occurs, the memory device 100 may not store the meta data due to the difference in size. If an SPO occurs, since the journal data stored in the journal buffer 430 includes only the most recent information on the sequential area, the size of that data stored in the memory device 100 may be small.

In response to the SPO occurrence, the journal data stored in the memory device 100 may be used in restoring the meta data included in the meta buffer 420 after the SPO occurs.

Figure 9:
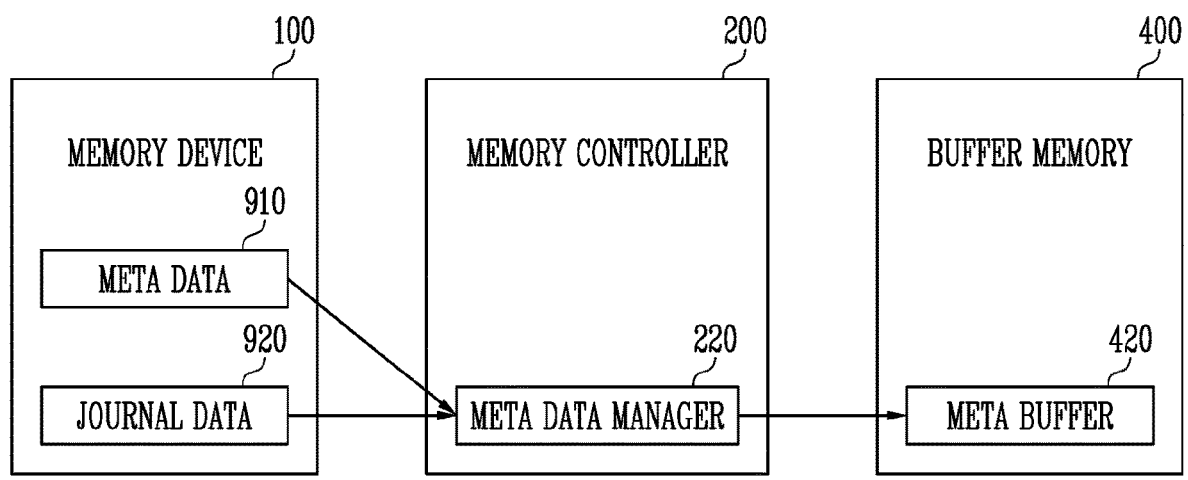
FIG. 9 is a diagram illustrating a method of restoring meta data when a sudden power off occurs according to an embodiment of the present disclosure.

FIG. 9 is a diagram illustrating a method of restoring meta data when a sudden power off (SPO) occurs according to an embodiment of the present disclosure.

Referring to FIG. 9, the meta data manager 220 may restore the meta data of the meta buffer 420 when the SPO occurs using a meta data 910 and a journal data 920 stored in the memory device 100. Here, the meta data 910 stored in the memory device 100 may mean meta data that was stored in the memory device 100 by the meta data manager 220 when a size of the meta data exceeded a predetermined value before the SPO occurs. In addition, the journal data 920 stored in the memory device 100 may mean journal data stored in the memory device 100 before power is completely turned off, which is generated when the journal manager 210 of FIG. 8 stores the journal data from the journal buffer 430 in the memory device 100 in response to the SPO occurrence. That is, a history from a time when the meta data 910 is stored to a time when the SPO occurs may be reflected by the journal data 920.

If first write pointer information, which is write pointer information included in the meta data 910 stored in the memory device 100, is different from second write pointer information, which is write pointer information included in the journal data 920 stored in the memory device 100, then the meta data manager 220 may change the first write pointer information to the second write pointer information. In addition, if first area state information, which is area state information included in the meta data 910 stored in the memory device 100, is different from second area state information, which is area state information included in the journal data 920 stored in the memory device 100, then the meta data manager 220 may change the first area state information to the second area state information. The meta data manager 220 may store the changed meta data in the meta buffer 420.

Thus, the meta data manager 220 may restore the meta data stored in the meta buffer 420 after the SPO occurs, by reflecting the journal data 920, which is the most recent information, on the meta data 910 stored in the memory device 100. Referring to FIG. 7, meta data and journal data for sequential areas Zone0, Zone1, Zone2, Zone3, and Zone4 may be generated. The meta data may be stored in the meta buffer, and the journal data may be stored in the journal buffer 710. In addition, when the size of the meta data stored in the meta buffer exceeds a predetermined value, the meta data may be stored in the memory device 100.

After the meta data 910 is stored in the memory device 100, a write operation on the second sequential area Zone2 may be performed. When the write operation on the second sequential area Zone2 is performed, meta data and journal data 722 for the second sequential area Zone2 may be changed. After the journal data 722 is updated, an SPO may occur. In response to the SPO occurrence, the journal manager 210 may store the journal data 920 in the memory device 100.

The meta data 910 stored in the memory device 100, however, may not reflect a result of performing the write operation on the second sequential area Zone2, while the journal data 920 stored in the memory device 100 may reflect the result of performing the write operation on the second sequential area Zone2. Therefore, the meta data manager 220 may restore the meta data stored in the meta buffer 420 after the SPO occurs, by reflecting the journal data 920, which is the most recent information, on the meta data 910 stored in the memory device 100.

In FIG. 9, the meta data 910 stored in the memory device 100 before the SPO occurs may be referred to as first meta data, and the meta data stored in the meta buffer 420 after the SPO occurs may be referred to as second meta data. According to another embodiment of the present disclosure, the memory controller may restore the second meta data using the first meta data 910 stored in the memory device and the journal data 920 stored in the memory device 100 in response to the SPO occurrence. For example, the memory controller may update the journal data in response to the second command for the sequential area in which the journal data exists before the SPO occurs. When the first write pointer information, which is the write pointer information included in the first meta data 910 stored in the memory device 100, is different from the second write pointer information, which is the write pointer information included in the journal data 920 stored in the memory device 100, the meta data manager 220 may change the first write pointer information to the second write pointer information. In addition, when the first area state information, which is the area state information included in the first meta data 910 stored in the memory device 100, is different from the second area state information, which is the area state information included in the journal data 920 stored in the memory device 100, the meta data manager 220 may change the first area state information to the second area state information. The meta data manager 220 may store the changed first meta data in the meta buffer 420. The changed first meta data may be the same as the second meta data.

Figure 10:
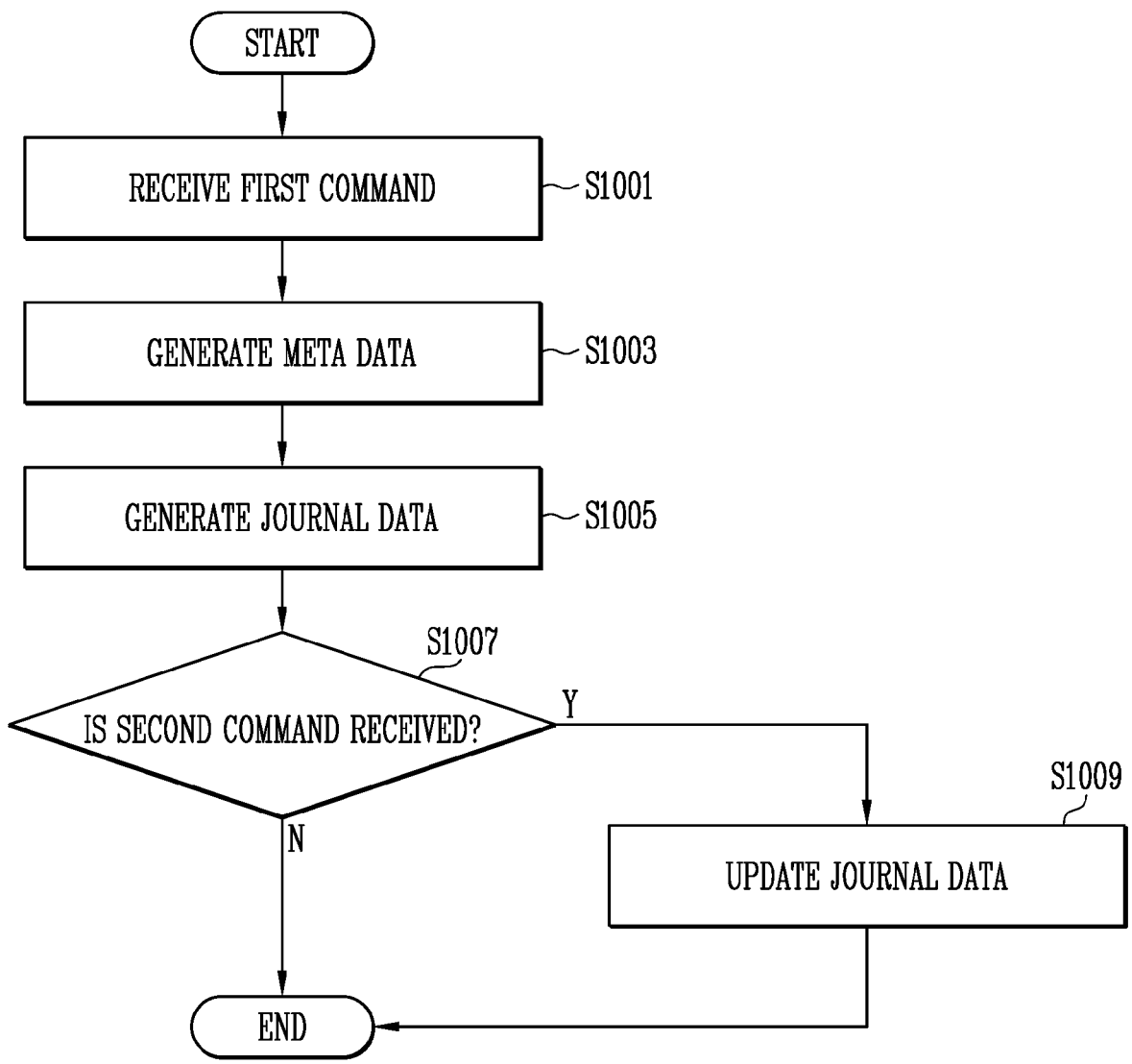
FIG. 10 is a flowchart illustrating a method of updating journal data according to an embodiment of the present disclosure.

FIG. 10 is a flowchart illustrating a method of updating journal data according to an embodiment of the present disclosure.

Referring to FIG. 10, a memory controller 200 may receive a command from a host 300 and perform a write operation of storing data in a sequential area. A journal data may be generated or updated in response to the write operation. The operation performed in FIG. 10 may correspond to the descriptions of FIGS. 6 and 7.

In step S1001, the memory controller 200 may receive a first command from the host 300 instructing the write operation of storing data in the sequential area. In step S1003, the memory controller 200 that receives the first command may generate a meta data corresponding to the sequential area in which the write operation is performed in response to the first command. The meta data may include a write pointer information indicating the logical address in which data is to be stored from among the logical addresses corresponding to the sequential area and may also include the area state information indicating whether the sequential buffer is allocated to the sequential area.

In step S1005, the memory controller 200 receiving the first command from the host 300 may generate a journal data corresponding to the sequential area in which the write operation is performed in response to the first command. The journal data may be generated based on the meta data generated by the memory controller 200.

In step S1007, the memory controller 200 may determine whether a second command for the sequential area in which the journal data exists is received from the host 300. When the memory controller 200 does not receive a second command, the operation of the memory system may be ended. When the memory controller 200 receives a second command, step S1009 may be performed.

In step S1009, the memory controller 200 may update the journal data in response to the second command for the sequential area in which the journal data exists. The memory controller 200 may update the existing journal data without generating the new journal data with respect to the sequential area in which the journal data exists. In the updated journal data, the write pointer information or the area state information, or both, may be changed.

As described above, the meta data and the journal data may be generated in the sequential area according to the first command received from the host 300. In addition, when a write operation is performed after the second command received from the host 300, the logical address indicated by the write pointer may be changed in accordance with the OWS of the sequential area. The meta data manager 220 may generate the new meta data including the changed write pointer information or may update the write pointer information included in the meta data. At this time, the journal manager 210 may update the write pointer information included in the journal data based on the updated meta data, and if the area state corresponding to the sequential area is changed, then the meta data and the journal data may be updated as well accordingly.

Figure 11:
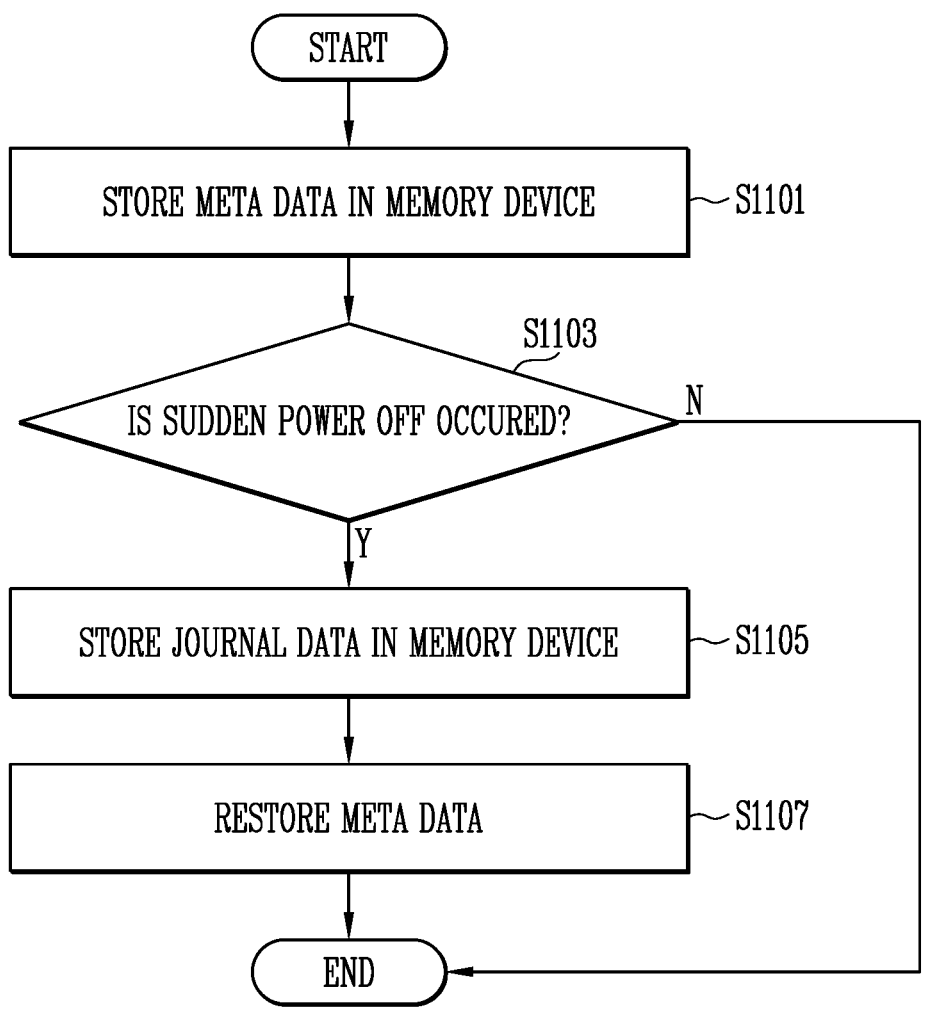
FIG. 11 is a flowchart illustrating a method of restoring meta data when a sudden power off occurs according to an embodiment of the present disclosure.

FIG. 11 is a flowchart illustrating a method of restoring meta data when a sudden power off (SPO) occurs according to an embodiment of the present disclosure.

Referring to FIG. 11, meta data lost due to an SPO occurrence may be restored. The operation performed in FIG. 11 may correspond to the descriptions of FIGS. 6, 8, and 9.

In step S1101, a meta data manager 220 may store the meta data in the memory device 100. The meta data manager 220 may store the meta data in the memory device 100 when the size of the meta data exceeds a predetermined value. In another embodiment of the present disclosure, the meta data manager 220 may store the meta data in the memory device 100 according to a predetermined time interval.

In step S1103, a journal manager 210 may determine whether an SPO occurs. When an SPO does not occur, the operation of the memory system may be ended. When the SPO occurs, step S1105 may be performed.

In step S1105, the journal manager 210 may store the journal data from a journal buffer 430 in the memory device 100 in response to the SPO occurrence. The journal data stored in the journal buffer 430 includes only the most recent information on the sequential area, so the size of the journal data to be stored in the memory device 100 is small. When the SPO occurs, the journal data may be stored in the memory device 100.

In step S1107, the meta data manager 220 may restore the meta data, which was included in the meta buffer 420 when the SPO occurs, using the meta data 910 and the journal data 920 stored in the memory device 100. Here, the meta data 910 stored in the memory device 100 may mean the meta data stored in the memory device 100 by the meta data manager 220 based on a size of the meta data exceeding a predetermined value before the SPO occurs. In addition, the journal data 920 stored in the memory device 100 may mean the journal data stored in the memory device 100 before power is completely turned off. The journal data 920 may be generated when the journal manager 210 of FIG. 8 stores the journal data from the journal buffer 430 in the memory device 100 in response to the SPO occurrence.

According to an embodiment of the present disclosure, when the first write pointer information, which is the write pointer information included in the meta data 910 stored in the memory device 100, is different from the second write pointer information, which is the write pointer information included in the journal data 920 stored in the memory device 100, the meta data manager 220 may change the first write pointer information to the second write pointer information. In addition, when the first area state information, which is the area state information included in the meta data 910 stored in the memory device 100, is different from the second area state information, which is the area state information included in the journal data 920 stored in the memory device 100, the meta data manager 220 may change the first area state information to the second area state information.

Figure 12:
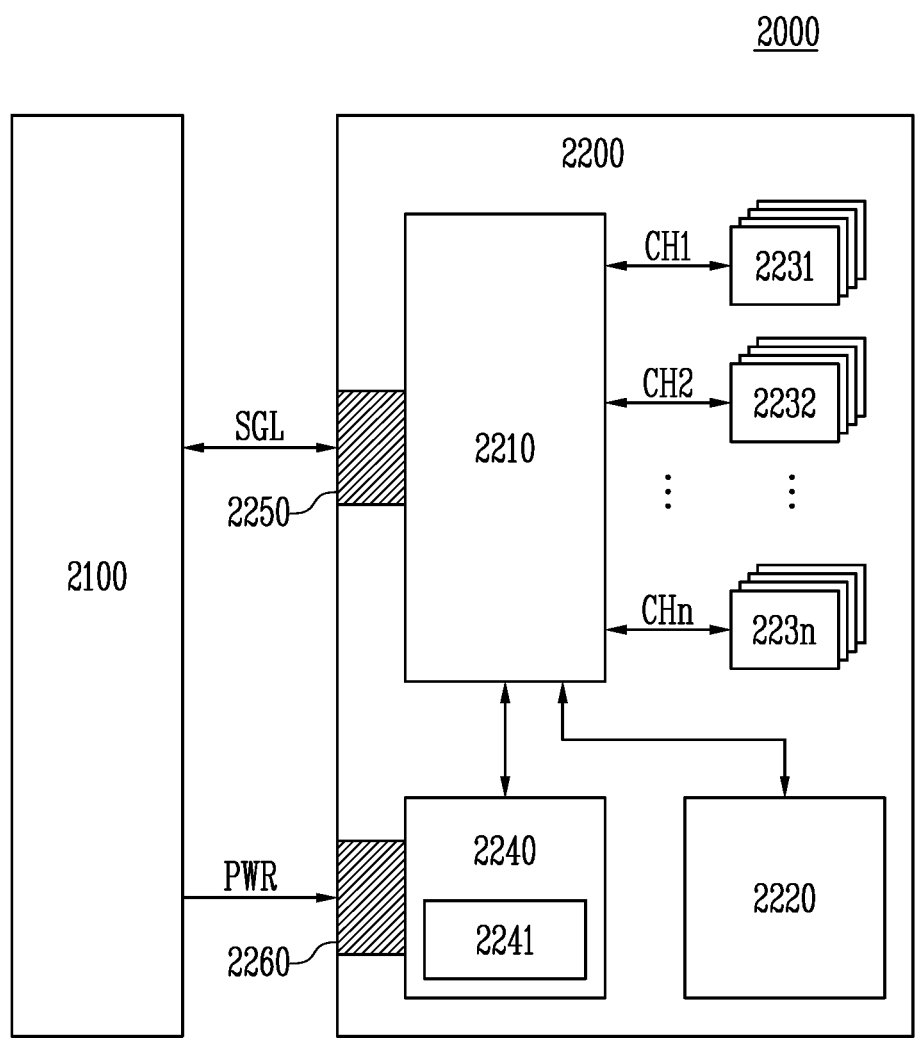
FIG. 12 is a diagram exemplarily illustrating a data processing system including a solid state drive according to an embodiment of the present disclosure.

FIG. 12 is a diagram exemplarily illustrating a data processing system including a solid state drive (SSD) according to an embodiment of the present disclosure. Referring to FIG. 12, a data processing system 2000 may include a host device 2100 and an SSD 2200.

The SSD 2200 may include a controller 2210, a buffer memory device 2220, nonvolatile memories 2231 to 223n, a power supply 2240, a signal connector 2250, and a power connector 2260.

The controller 2210 may control an overall operation of the SSD 2200.

The buffer memory device 2220 may temporarily store data to be stored in the nonvolatile memories 2231 to 223n. In addition, the buffer memory device 2220 may temporarily store data read from the nonvolatile memories 2231 to 223n. The data temporarily stored in the buffer memory device 2220 may be transmitted to the host device 2100 or the nonvolatile memories 2231 to 223n under the control of the controller 2210.

The nonvolatile memories 2231 to 223n may be used as a storage medium of the SSD 2200. Each of the nonvolatile memories 2231 to 223n may be connected to the controller 2210 through a plurality of channels CH1 to CHn. One or more nonvolatile memories may be connected to one channel. Furthermore, the nonvolatile memories connected to one channel may be connected to the same signal bus and data bus.

The power supply 2240 may provide power PWR input through the power connector 2260 into the SSD 2200. The power supply 2240 may include an auxiliary power supply 2241. The auxiliary power supply 2241 may supply power so that the SSD 2200 is normally ended when a sudden power off occurs. The auxiliary power supply 2241 may include large capacity capacitors capable of charging the power PWR.

The controller 2210 may exchange a signal SGL with the host device 2100 through the signal connector 2250. Here, the signal SGL may include a command, an address, data, and the like. The signal connector 2250 may be configured as various types of connectors according to an interface method between the host device 2100 and the SSD 2200.

Figure 13:
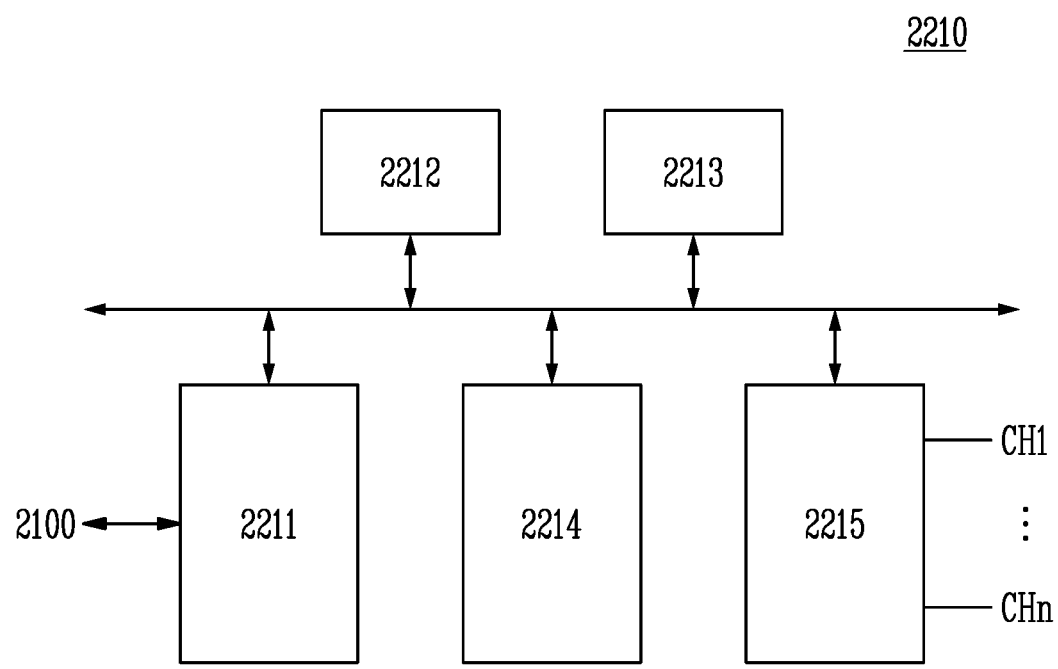
FIG. 13 is a diagram exemplarily illustrating a configuration of a controller of FIG. 12.

FIG. 13 is a diagram exemplarily illustrating a configuration of a controller of FIG. 12. Referring to FIG. 13, a controller 2210 may include a host interface unit 2211, a control unit 2212, a random access memory 2213, an error correction code (ECC) unit 2214, and a memory interface unit 2215.

The host interface unit 2211 may interface with the host device 2100 and the SSD 2200 according to a protocol of the host device 2100. For example, the host interface unit 2211 may communicate with the host device 2100 through any one of secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI Express (PCI-E), and universal flash storage (UFS) protocols. In addition, the host interface unit 2211 may perform a disk emulation function that supports the host device 2100 to recognize the SSD 2200 as a general-purpose data storage device, such as for example, a hard disk drive (HDD).

The control unit 2212 may analyze and process the signal SGL input from the host device 2100. The control unit 2212 may control an operation of internal functional blocks according to firmware or software for driving the SSD 2200. The random access memory 2213 may be used as an operation memory for driving such firmware or software.

The ECC unit 2214 may generate parity data of data to be transmitted to the nonvolatile memories 2231 to 223n. The generated parity data may be stored in the nonvolatile memories 2231 to 223n together with the data. The ECC unit 2214 may detect an error of data read from the nonvolatile memories 2231 to 223n based on the parity data. When the detected error is within a correction range, the ECC unit 2214 may correct the detected error.

The memory interface unit 2215 may provide a control signal such as a command and an address to the nonvolatile memories 2231 to 223n under the control of the control unit 2212. In addition, the memory interface unit 2215 may exchange data with the nonvolatile memories 2231 to 223n under the control of the control unit 2212. For example, the memory interface unit 2215 may provide the data stored in the buffer memory device 2220 to the nonvolatile memories 2231 to 223n, or provide the data read from the nonvolatile memories 2231 to 223n to the buffer memory device 2220.

Figure 14:
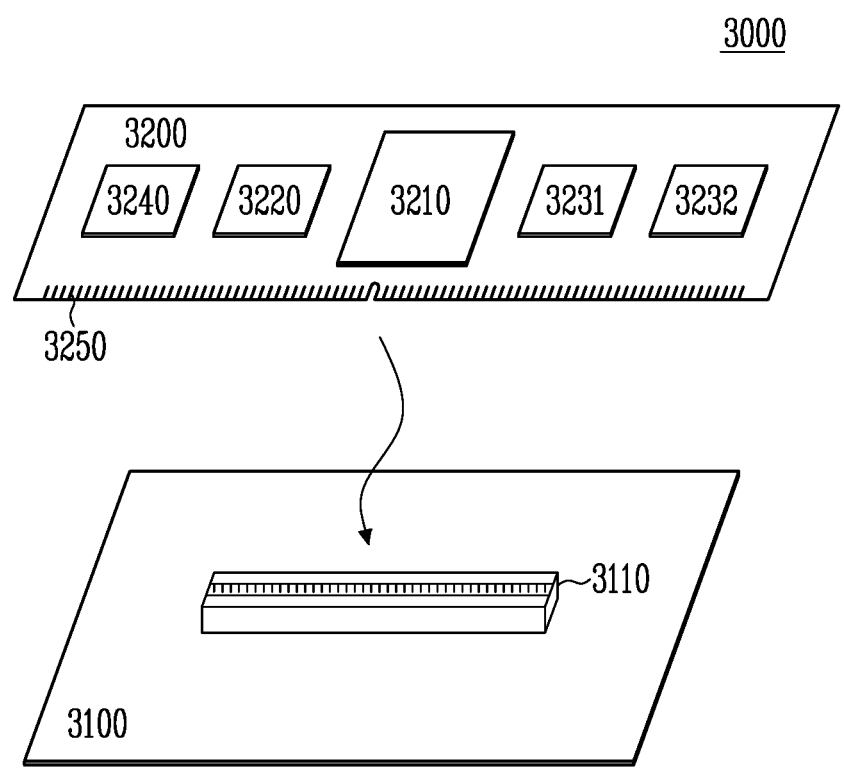
FIG. 14 is a diagram exemplarily illustrating a data processing system including a data storage device according to an embodiment of the present disclosure.

FIG. 14 is a diagram exemplarily illustrating a data processing system including a data storage device according to an embodiment of the present disclosure. Referring to FIG. 14, a data processing system 3000 may include a host device 3100 and a data storage device 3200.

The host device 3100 may be configured in a form of a board such as a printed circuit board. Although not shown, the host device 3100 may include internal functional blocks for performing a function of the host device.

The host device 3100 may include a connection terminal 3110 such as a socket, a slot, or a connector. The data storage device 3200 may be mounted on the connection terminal 3110.

The data storage device 3200 may be configured in a form of a board such as a printed circuit board. The data storage device 3200 may be referred to as a memory module or a memory card. The data storage device 3200 may include a controller 3210, a buffer memory device 3220, nonvolatile memories 3231 to 3232, a power management integrated circuit (PMIC) 3240, and a connection terminal 3250.

The controller 3210 may control an overall operation of the data storage device 3200. The controller 3210 may be configured identically to the controller 2210 shown in FIG. 12.

The buffer memory device 3220 may temporarily store data to be stored in the nonvolatile memories 3231 to 3232. In addition, the buffer memory device 3220 may temporarily store data read from the nonvolatile memories 3231 to 3232. The data temporarily stored in the buffer memory device 3220 may be transmitted to the host device 3100 or the nonvolatile memories 3231 to 3232 under control of the controller 3210.

The nonvolatile memories 3231 to 3232 may be used as a storage medium of the data storage device 3200.

The PMIC 3240 may provide power input through the connection terminal 3250 into the data storage device 3200. The PMIC 3240 may manage the power of the data storage device 3200 according to the control of the controller 3210.

The connection terminal 3250 may be connected to the connection terminal 3110 of the host device. The power and a signal such as a command, an address, and data may be transmitted between the host device 3100 and the data storage device 3200 through the connection terminal 3250. The connection terminal 3250 may be configured as various types of connections according to an interface method between the host device 3100 and the data storage device 3200. The connection terminal 3250 may be disposed on any one side of the data storage device 3200.

Figure 15:
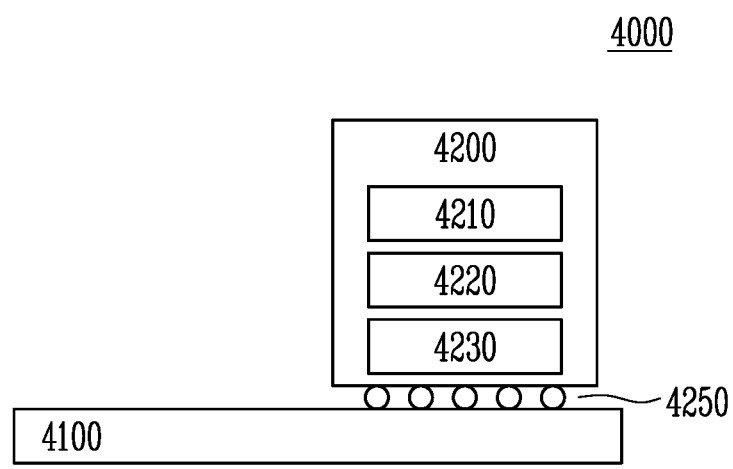
FIG. 15 is a diagram exemplarily illustrating a data processing system including a data storage device according to an embodiment of the present disclosure.

FIG. 15 is a diagram exemplarily illustrating a data processing system including a data storage device according to an embodiment of the present disclosure. Referring to FIG. 15, a data processing system 4000 may include a host device 4100 and a data storage device 4200.

The host device 4100 may be configured in a form of a board such as a printed circuit board. Although not shown, the host device 4100 may include internal functional blocks for performing a function of the host device.

The data storage device 4200 may be configured in a form of a surface mounted package. The data storage device 4200 may be mounted on the host device 4100 through a solder ball 4250. The data storage device 4200 may include a controller 4210, a buffer memory device 4220, and a nonvolatile memory 4230.

The controller 4210 may control an overall operation of the data storage device 4200. The controller 4210 may be configured identically to the controller 2210 shown in FIG. 12.

The buffer memory device 4220 may temporarily store data to be stored in the nonvolatile memory 4230. In addition, the buffer memory device 4220 may temporarily store data read from the nonvolatile memories 4230. The data temporarily stored in the buffer memory device 4220 may be transmitted to the host device 4100 or the nonvolatile memory 4230 under the control of the controller 4210.

The nonvolatile memory 4230 may be used as a storage medium of the data storage device 4200.

Figure 16:
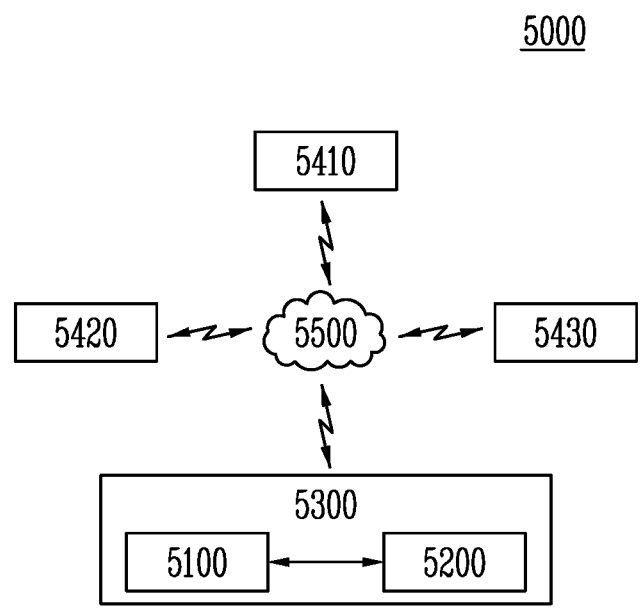
FIG. 16 is a diagram exemplarily illustrating a network system including a data storage device according to an embodiment of the present disclosure.

FIG. 16 is a diagram exemplarily illustrating a network system including a data storage device according to an embodiment of the present disclosure. Referring to FIG. 16, a network system 5000 may include a server system 5300 and a plurality of client systems 5410 to 5430 connected through a network 5500.

The server system 5300 may service data in response to a request of the plurality of client systems 5410 to 5430. For example, the server system 5300 may store data provided from the plurality of client systems 5410 to 5430. As another example, the server system 5300 may provide data to the plurality of client systems 5410 to 5430.

The server system 5300 may include a host device 5100 and a data storage device 5200. The data storage device 5200 may include the memory system 50 of FIG. 1, the SSD 2200 of FIG. 12, the data storage device 3200 of FIG. 14, and the data storage device 4200 of FIG. 15.

According to an embodiment of the present disclosure, since the journal data is regenerated in response to every write command received from the host, the amount of the journal data may be reduced because only the most recently updated journal data is stored. While the amount of generated journal data is reduced, the frequency of storing the meta data resulting from write operations in the memory device also may be reduced, with no detrimental effects resulting from an SPO. When the generation frequency of the write operation of storing the meta data in the memory device is reduced, performance of a NAND memory may be improved, and a life of the NAND memory may also be improved.

According to an embodiment of the present disclosure, the number of times the write operation of storing the meta data in the memory device is performed may be reduced. As the operation of storing the meta data is reduced, the write operation of user data may be smoothly performed. Accordingly, performance of the memory system may be improved.

According to an embodiment of the present disclosure, as the number of times the meta data is stored is reduced, a program/erase cycle in a NAND memory may be reduced. Accordingly, a life of the memory device may be increased.

According to an embodiment of the present disclosure, since it is possible to respond to the SPO occurrence only with the most recently updated journal data, a valid page table (VPT) may be removed.

Since the present disclosure may be implemented in other specific forms without changing the technical spirit or essential features thereof, those of ordinary skill in the art to which the present disclosure pertains should understand that the embodiments described above are illustrative and are not limited in all aspects. The scope of the present disclosure is indicated by the claims to be described later rather than the detailed description, and all changes or modifications derived from the meaning and scope of the claims and their equivalent concepts are interpreted as being included in the scope of the present disclosure.

What is claimed is:

1. A memory system comprising:
   a memory device including at least one sequential area in which a data provided from a host and corresponding to consecutive logical addresses of the at least one sequential area is stored;

a sequential buffer configured to temporarily store the data to be stored in the at least one sequential area;
a meta buffer configured to store a meta data including a write pointer information indicating a logical address in which the data is to be stored from among logical addresses corresponding to the at least one sequential area, and an area state information indicating whether the sequential buffer is allocated to the at least one sequential area; and
a memory controller configured to perform a write operation of storing the data in the at least one sequential area in response to a first command received from the host using the meta data,
wherein the memory controller generates a journal data including a write pointer information and an area state information corresponding to the at least one sequential area in which the write operation is performed in response to the first command, and updates the journal data in response to a second command for an operation in the at least one sequential area with pre-existing journal data.

2. The memory system of claim 1, wherein the memory controller further comprises a journal manager configured to change the write pointer information included in the journal data when a write operation is performed in response to the second command and to change the area state information included in the journal data when a state of the at least one sequential area is changed in response to the second command.

3. The memory system of claim 2, wherein the memory controller further comprises a meta data manager configured to change the write pointer information included in the meta data when the write operation is performed in response to the second command and to change the area state information included in the meta data when the state of the at least one sequential area is changed in response to the second command.

4. The memory system of claim 3, wherein the journal manager stores the journal data in the memory device when a size of the journal data exceeds a predetermined value, and
the meta data manager stores the meta data in the memory device when a size of the meta data exceeds a predetermined value.

5. The memory system of claim 3, wherein the journal manager stores the journal data in the memory device according to a first predetermined time interval, and
the meta data manager stores the meta data in the memory device according to a second predetermined time interval.

6. The memory system of claim 4, wherein the journal manager stores the journal data in the memory device when a sudden power off occurs, and
the meta data manager restores the meta data stored in the meta buffer, when the sudden power off occurs, using the meta data stored in the memory device and the journal data stored in the memory device.

7. The memory system of claim 6, wherein when a first write pointer information, which is the write pointer information included in the meta data stored in the memory device, is different from a second write pointer information, which is the write pointer information included in the journal data stored in the memory device, the meta data manager changes the first write pointer information to the second write pointer information and stores the changed meta data in the meta buffer.

8. The memory system of claim 6, wherein when a first area state information, which is the area state information included in the meta data stored in the memory device, is different from a second area state information, which is the area state information included in the journal data stored in the memory device, the meta data manager changes the first area state information to the second area state information and stores the changed meta data in the meta buffer.

9. The memory system of claim 1, further comprising:
a journal buffer including the journal data for each of the at least one sequential area in which the write operation is performed from among a plurality of sequential areas included in the memory device.

10. A memory system comprising:
a memory device including at least one sequential area in which a data corresponding to consecutive logical addresses of the at least one sequential area provided from a host is stored;
a sequential buffer configured to temporarily store the data to be stored in the at least one sequential area;
a meta buffer configured to store a first meta data including a write pointer information indicating a logical address in which the data is to be stored from among logical addresses corresponding to the at least one sequential area, and an area state information indicating whether the sequential buffer is allocated to the at least one sequential area; and
a memory controller configured to perform a write operation of storing the data in the at least one sequential area in response to a first command received from the host using the first meta data, to generate a journal data including a write pointer information and an area state information corresponding to the at least one sequential area in which a write operation is performed in response to a first command, and to restore a second meta data stored in the meta buffer using the first meta data stored in the memory device and the journal data stored in the memory device when a sudden power off occurs,
wherein the memory controller updates the journal data in response to a second command for an operation in the at least one sequential area with pre-existing journal data.

11. The memory system of claim 10, wherein the memory controller further comprises a journal manager configured to change the write pointer information included in the journal data when a write operation is performed in response to the second command and to change the area state information included in the journal data when a state of the at least one sequential area is changed in response to the second command.

12. The memory system of claim 11, wherein the memory controller further comprises a meta data manager configured to change the write pointer information included in the meta data when the write operation is performed in response to the second command and to change the area state information included in the meta data when the state of the at least one sequential area is changed in response to the second command.

13. The memory system of claim 12, wherein the journal manager stores the journal data in the memory device when a size of the journal data exceeds a predetermined value, and
the meta data manager stores the meta data in the memory device when a size of the meta data exceeds a predetermined value.

14. The memory system of claim 12, wherein the journal manager stores the journal data in the memory device according to a first predetermined time interval, and the meta data manager stores the meta data in the memory device according to a second predetermined time interval.

15. The memory system of claim 13, wherein when a first write pointer information, which is the write pointer information included in the first meta data, is different from a second write pointer information, which is the write pointer information included in the journal data stored in the memory device, the meta data manager changes the first write pointer information to the second write pointer information and stores the changed first meta data in the meta buffer.

16. The memory system of claim 13, wherein when a first area state information, which is the area state information included in the first meta data, is different from a second area state information, which is the area state information included in the journal data stored in the memory device, the meta data manager changes the first area state information to the second area state information and stores the changed first meta data in the meta buffer.

17. The memory system of claim 10, further comprising:
a journal buffer including the journal data for each of the at least one sequential area in which the write operation is performed from among a plurality of sequential areas included in the memory device.

18. A method of operating a memory system comprising a memory device including at least one sequential area in which a data corresponding to consecutive logical addresses provided from a host is stored, a sequential buffer configured to temporarily store the data to be stored in the at least one sequential area, a meta buffer configured to store a meta data including a write pointer information indicating a logical address in which the data is to be stored from among logical addresses corresponding to the at least one sequential area, and an area state information indicating whether the sequential buffer is allocated to the at least one sequential area, and a memory controller configured to perform a write operation of storing the data in the at least one sequential area in response to a first command received from the host using the meta data, the method comprising:

generating a journal data including a write pointer information and an area state information corresponding to the at least one sequential area in which the write operation is performed in response to the first command; and
updating the journal data in response to a second command for the at least one sequential area in which the journal data exists.

19. The method of claim 18, wherein updating comprises:
changing the write pointer information included in the journal data when the write operation is performed in response to the second command; and
changing the area state information included in the journal data when the state of the at least one sequential area is changed in response to the second command.

20. The method of claim 19, further comprising:
storing the meta data in the memory device when a size of the meta data exceeds a predetermined value;
storing the journal data in the memory device when a sudden power off occurs; and
restoring the meta data stored in the meta buffer using the meta data stored in the memory device and the journal data stored in the memory device when the sudden power off occurs.

21. The method of claim 20, wherein restoring comprises:
changing a first write pointer information to a second write pointer information when the first write pointer information, which is the write pointer information included in the meta data stored in the memory device, is different from the second write pointer information, which is the write pointer information included in the journal data stored in the memory device;
changing a first area state information to a second area state information when the first area state information, which is the area state information included in the meta data stored in the memory device, is different from the second area state information, which is the area state information included in the journal data stored in the memory device; and
storing the changed meta data in the meta buffer.

* * * * *